United States Patent
Geissler et al.

[11] Patent Number: 5,492,079
[45] Date of Patent: Feb. 20, 1996

[54] PROCESS FOR PRODUCING RODS OR BLOCKS OF SEMICONDUCTOR MATERIAL AND AN APPARATUS FOR CARRYING OUT THE PROCESS

[75] Inventors: Joachim Geissler, Stammham; Ulrich Angres, Marktl, both of Germany

[73] Assignee: Wacker-Chemitronic Gesellschaft für Elektronik-Grundstoffe mbH, Burghausen, Germany

[21] Appl. No.: 270,433

[22] Filed: Jul. 5, 1994

[30] Foreign Application Priority Data

Jul. 15, 1993 [DE] Germany ............... 43 23 793.2

[51] Int. Cl.⁶ ............................................. C30B 15/08
[52] U.S. Cl. ........................ 117/30; 117/33; 117/910; 117/932
[58] Field of Search .................... 117/910, 932, 117/30, 33

[56] References Cited

U.S. PATENT DOCUMENTS

| | | | |
|---|---|---|---|
| 3,194,691 | 7/1965 | Dikhoff | 117/33 |
| 3,998,686 | 12/1976 | Meiling et al. | 117/33 |
| 4,312,700 | 1/1982 | Helmreich et al. | |
| 4,358,416 | 11/1982 | Yarwood et al. | 117/910 |
| 4,824,519 | 4/1989 | Ostrogorsky | 117/910 |
| 4,834,832 | 5/1989 | Stock et al. | |
| 5,108,720 | 4/1992 | Bourbina et al. | |

FOREIGN PATENT DOCUMENTS

| | | | |
|---|---|---|---|
| 2635373 | 4/1977 | Germany | 117/910 |
| 138279 | 10/1979 | Germany | 117/910 |
| 2925679 | 1/1981 | Germany . | |
| 3531610 | 3/1987 | Germany . | |
| 4216519 | 2/1993 | Germany . | |
| 62-246894 | 10/1987 | Japan | 117/33 |

Primary Examiner—Robert Kunemund
Attorney, Agent, or Firm—Collard & Roe

[57] ABSTRACT

The process includes processing a molten phase of semiconductor material covering a solid phase of the material and having a free surface opposite this solid phase, into which, during the crystallization procedure, energy is radiated and material is fed in in granular form, which material floats and is melted. As a result, at the opposite solid/liquid interface, material grows on the solid phase which is drawn downwards in accordance with the growth rate. The process allows mono- or polycrystalline rods or blocks to be obtained. The main advantages of the process are that it can be carried out without melting vessels, it is possible to use granular material, and the energy balance is favorable because of the small amounts of melt.

10 Claims, 2 Drawing Sheets

PROCESS FOR PRODUCING RODS OR BLOCKS OF SEMICONDUCTOR MATERIAL AND AN APPARATUS FOR CARRYING OUT THE PROCESS

BACKGROUND OF THE INVENTION

1. Field of the Invention

The present invention relates to a process for producing rods or blocks of semiconductor material which expands on solidification by crystallization of a melt produced from granular material, and also apparatus for carrying out the process.

2. The Prior Art

Mono- or polycrystalline rods or blocks of silicon are usually produced by the Czochralski crucible-drawing process, by zone drawing without a crucible or by casting processes in which a silicon melt is cast into molds of quartz or graphite and is subjected there to controlled solidification. Zone drawing requires polycrystalline stock rods produced by gentle gas phase deposition under carefully monitored conditions. Although the starting material used in crucible drawing or casting processes can be pieces of polycrystalline silicon deposited with less effort in comparison, the crucibles or molds used are a possible cause both of contamination and of additional costs. Similar problems also occur, because of the long contact time of molten silicon with vessel walls of foreign material, for example, in the process according to German Patent 2,925,679 or in the corresponding U.S. Pat. No. 4,312,700, in which a silicon melt produced in a separate melting crucible is fed into a crystallization chamber in which there is maintained a pool of melt from which the crystallizing material is drawn off downwards. The same applies to the process according to German Patent 3,531,610, in which the pool of melt is enclosed by rollers manufactured from material inert to silicon, the molten silicon being poured into the free surface thereof, while the solidifying material is drawn off downwards in a similar way to the previously mentioned process. While the casting processes mentioned are essentially used for the production of base material for solar cells, the rods obtained by crucible or zone drawing are usually sawn into wafers from which, in most cases, electronic or power components are then manufactured. The fields of application of the individual process are limited; thus, for example, casting or crucible-drawing processes do not allow for the production of material which corresponds to zone-drawn material, for example, with respect to the type and proportion of impurities. In addition, the energy balance of some processes is unfavorable: while on the one hand, a relatively large amount of melt has to be prepared with high energy consumption, after crystallization a similar significant amount of energy has to be conducted away again by cooling.

SUMMARY OF THE INVENTION

It is an object of the present invention to provide a process which is widely applicable and for semiconductor materials such as germanium or particularly silicon allows the production of both single-crystal rods and multi-crystal blocks with a favorable energy balance, which meets the highest purity demands and, particularly in the production of single crystals, makes possible the use of material in granular form without having to reply on the use of melting crucibles.

This object is achieved by a process which comprises producing a molten phase of the semiconductor material covering a solid phase of the material and having a free surface opposite this solid phase, and during the crystallization procedure maintaining the molten phase by supplying energy and charging granular material continuously or batchwise to the free surface of the melt, whereby at the opposite melt surface the material is made to grow on the solid semiconductor phase.

The energy required to produce and maintain the molten phase of the semiconductor material, in particular silicon, is advantageously supplied in the form of radiant energy. The use of electron radiation for this purpose is particularly advantageous, since this type of energy supply allows the usual purity requirements in semiconductor technology to be met without problems, and at the same time, the region affected and the radiated energy dose can be easily controlled and varied. One or more radiation sources can act on the region to be melted or maintained in the molten state, to ensure a sufficient energy supply to the whole free surface of the molten silicon phase. In many cases, it has also proven to be favorable to scan the area to be irradiated with one or more electron beams which each act on a sub-area which is smaller than the area to be irradiated. In principle, it is also feasible to use other electromagnetic radiation such as, for example, light radiation which is, for example, directed onto the area to be irradiated by means of laser sources or high-energy light sources such as mercury vapor lamps, it being possible to ensure uniform irradiation of the area, if desired, by scanning or focusing by means of suitable reflectors. In another embodiment the energy to maintain the molten phase of semiconductor material is supplied by means of an induction heating coil. Suitable induction coils are known, for example, from floating zone crystal growth.

The process is basically suitable for the crystallization of all semiconductor materials which display the phenomenon of volume expansion on solidification, i.e., which possess a lower density in the solid state than in the molten state. These are essentially the elemental semiconductors germanium and particularly silicon as the currently most important semiconductor material in electronics and solar cell technology, in which the volume increase on solidification is about 10%. For reasons of simplification, the following embodiments refer only to silicon, but they can also be analogously applied to germanium or other materials, in particular semiconductor materials, which expand on solidification.

The process is commenced by, in a first step, producing a molten silicon phase which covers a solid silicon phase and possesses a free surface opposite this interface with the solid phase. This can occur, for example, by melting a mono- or polycrystalline silicon crystal possessing the intended cross section and the intended crystal structure, e.g., round, rectangular or square, which can thus simultaneously act as seed crystal, from its face until there has formed a pool of melt of the intended depth lying on top of the unmelted residual crystal. The external circumference of this pool of melt can be stabilized, if desired, by supporting or shaping elements. Another possibility comprises providing a, for example, disk-shaped or tabular, sheet of silicon which is gradually melted in such a way that there is formed a lens of melt surrounded on its sides by a ring of unmelted solid silicon. The diameter of this lend-shaped pool of melt can be influenced by varying the irradiated area, e.g., reduced or expanded and finally determines the cross section of the crystal obtained therefrom. The surface of the lens of melt opposite the free surface absorbing the radiated energy is suitable, for example, for the placement of seed crystals or support crystals by means of which it can be stabilized and the crystallization can be initiated.

A further possibility for producing the pool of melt is by coating a, for example, tabular, disk-shaped or block-shaped base crystal, if desired provided with a suitable depression or recess, with granular material on its surface facing the radiation source and melting this granular material, it being possible to additionally provide a holder, advantageously of massive silicon, surrounding on the sides the pool of melt formed. The granular material can also be incompletely melted; it is then possible to produce a sintered intermediate layer of granular material between the base crystal and the actual pool of melt, in particular if no monocrystalline product is to be produced. In this case, the intermediate layer can also be applied directly onto the substrate which is advantageously coolable and comprises, for example, metal or ceramic material, without a base crystal of silicon being provided.

In the process, the granular material to be charged is advantageously used in particle sizes from 0.1 to 10 mm, preferably from 1 to 6 mm, with these figures meaning that in each case the material completely passes through a sieve having a mesh size corresponding to the selected upper limit and no longer passes through a sieve having a mesh size corresponding to the selected lower limit. In the case of granular material having a lower particle size, experience has shown that there is the possibility of swirling in the receptacle, while larger grains possibly have too large an immersion depth in the pool of melt and can disturb the crystallization front. The suitable particle size fractions can be separated out from the known, available, granular silicon materials with their comparatively large particle size ranges by conventional classification processes, for example, by means of sieving. Here, the finely grained fraction can be separated out, for example, by means of a sieve having a 0.1 mm mesh size, and the coarser grained fraction can be separated out by means of a sieve having a 10 mm mesh size, so that, finally, there remains a granular material fraction varying between these lower and upper limits. However, particularly in growing single crystals or in largely automated processes, comparatively narrower limits, advantageously between 1 and 6 mm, will be selected, since then a more uniform melting behavior of the granular material charged is to be expected. Coarse-grained granular materials also have the advantage that, because of the smaller surface area, they introduce less oxygen into the system via the oxide skin surrounding the grains. The granular material can, for example, have been produced by mechanical comminution of polycrystalline silicon deposited on heated carrier bodies. Likewise suitable is material in granular form which has been produced by a fluidized-bed deposition process and typically has an almost spherical shape.

The first stage of the process is concluded when the pool of melt has reached the desired breadth and depth and the phase boundary between the molten phase and the solid phase has stabilized in position. To maintain this state corresponding, in the ideal case, to a thermodynamic equilibrium between melt and crystal, it is then sufficient to supply the melt, via the free melt surface, with that amount of energy which it loses, for example, by radiation losses and the like. In practice, therefore, a temperature gradient exists within the melt between the hotter free surface absorbing the radiated energy and the cooler solid/melt phase interface opposite, at which the temperature corresponds to the melting point of silicon. If the equilibrium state is disturbed by additionally supplying, via the free surface, the molten phase with granular material which remains floating on the surface because of its lower density, this first effects a change in the temperature conditions in the melt as a result of which material starts to crystallize out of the melt on the opposite phase boundary adjoining the solid phase, i.e., the solid phase moves forward and the crystal covered by the molten phase grows. To the degree to which the granular material goes over into the molten state, the crystallization process proceeds at the opposite phase boundary. Growth ends when all granular material has melted and an equilibrium state between molten and covered solid phase has again been reached.

The actual crystal production process can thus be initiated and continued by charging granular silicon material into the free surface of the molten phase produced in the first process stage. This feeding of granular material can be carried out continuously or batchwise, with the continuous addition being preferred because of the more uniform crystallization rate and the resulting constant drawing or lowering rate. The granular material here can be charged with the aid of the known feeding and metering devices such as, for example, shaking ducts or vibrational or rotational conveyors. The feed rate to be maintained in each case is advantageously estimated by calculation and/or determined in preliminary experiments, the main factors having to be taken into account being, besides the size of the free surface to be supplied, the amount of energy present in the melt and also the possible growth or crystallization rates in the transition region to the solid silicon phase opposite the free surface. If the molten phase of semiconductor material is maintained by means of an induction heating coil, the granular material is preferably charged via the annular opening of the induction heating coil or via the gap between the induction heating coil and the surface of the molten phase.

To ensure a sufficient thickness and a sufficient heat capacity of the silicon melt, the temperature of the melt in the region of the free surface is advantageously maintained at values which are up to about 200° C., preferably from 50° C. to 150° C., above the melting point of silicon (about 1420° C.). This superheating of the free melt surface simultaneously ensures that the grains of granular material subsequently charged are melted at the desired rate. It can thereby be ensured that the energy content of the molten phase is sufficient to achieve greater melting rates than the crystallization rates permissible on the other hand for the growth of rods or blocks low in or free of defects. This can be supported, for example, by matching the process parameters to one another in such a way that the volume of the melt is kept significantly greater than the volume of each of the subsequently charged grains of granular material floating in the melt in the unmolten state. If desired, the granular material can also be used in the preheated state.

The melt temperature at the free surface can be monitored with the aid of the temperature measuring apparatus also known from crucible or zone drawing. As an example of such suitable apparatus, mention may be made of pyrometers.

With the addition of granular material into the free surface of the molten phase and the gradual melting thereof, the growth of the solid phase commences at the opposite liquid/solid phase boundary, whereby the latter moves forward in the direction of the melt in accordance with the growth rate. In principle, there is then the possibility of leaving the rod or block, which may be rotated if desired, in a fixed position, so that as a result of the growth of the solid phase, the molten phase migrates ever further upwards. This process variant has the precondition that the radiation source and the charging facility are interlinked with this migratory movement of the melt and likewise move upwards in accordance with the growing crystal. However, such a process is complicated in terms of apparatus. Preference is therefore given to process variants in which the radiation source, charging facility and molten phase remain in an essentially fixed position, while the solid phase is lowered at a rate essentially corresponding to the rate of growth of the silicon. This rate can be varied depending on the type of product desired. Thus, for example, blocks of polycrystalline silicon which serve as base material for solar cells can be produced at faster growth rates than monocrystalline rods for the production of wafers for the manufacture of electronic components. Typical growth rates, and thus also lower rates, are in the range of from 0.5 to 5 mm/min for polycrystalline material, while for monocrystalline material values of from 0.2 to 3 mm/min can usually be achieved. From the lowering rate then set in each concrete case and the resulting amount of silicon removed in solid form from the molten phase, it is possible, for example, to also determine the required amount of granular material which has to be charged in each case. Vice versa, if the amount of granular material to be charged is the limiting factor, the lowering rate can also be matched correspondingly.

Substrates which can be lowered and which, if desired, can also be rotated, and which allow the holding and controlled vertical movement of the growing silicon rod or block, are known and described in, for example, in the patent literature mentioned above, in the background of the invention. Suitable substrates are, for example, plates which are connected to a drawing shaft and which can, if desired, be cooled, and on which rests the silicon initially provided and, for example, serving as substrate for the molten phase, from which silicon the growth process proceeds. Use can also be made, for example, of holders of the rod-holding type and of the rod-support type of devices. Use can also be made of take-up devices known from crucible-free zone drawing, in which devices a small seed crystal is fixed in a holder having a surrounding support facility for the growing crystal which has a larger diameter.

The process is generally carried out in receptacles which allow the setting and maintenance of a suitable working atmosphere. These can be selected and adjusted, in the manner known from other crystal growing processes, according to the energy source used and/or desired doping or purifying effects in each case. In principle, the process can here be conducted within pressure ranges, which vary from a vacuum, up the ultra-high range, into the superatmospheric range.

BRIEF DESCRIPTION OF THE DRAWINGS

Other objects and features of the present invention will become apparent from the following detailed description considered in connection with the accompanying drawings which discloses the embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
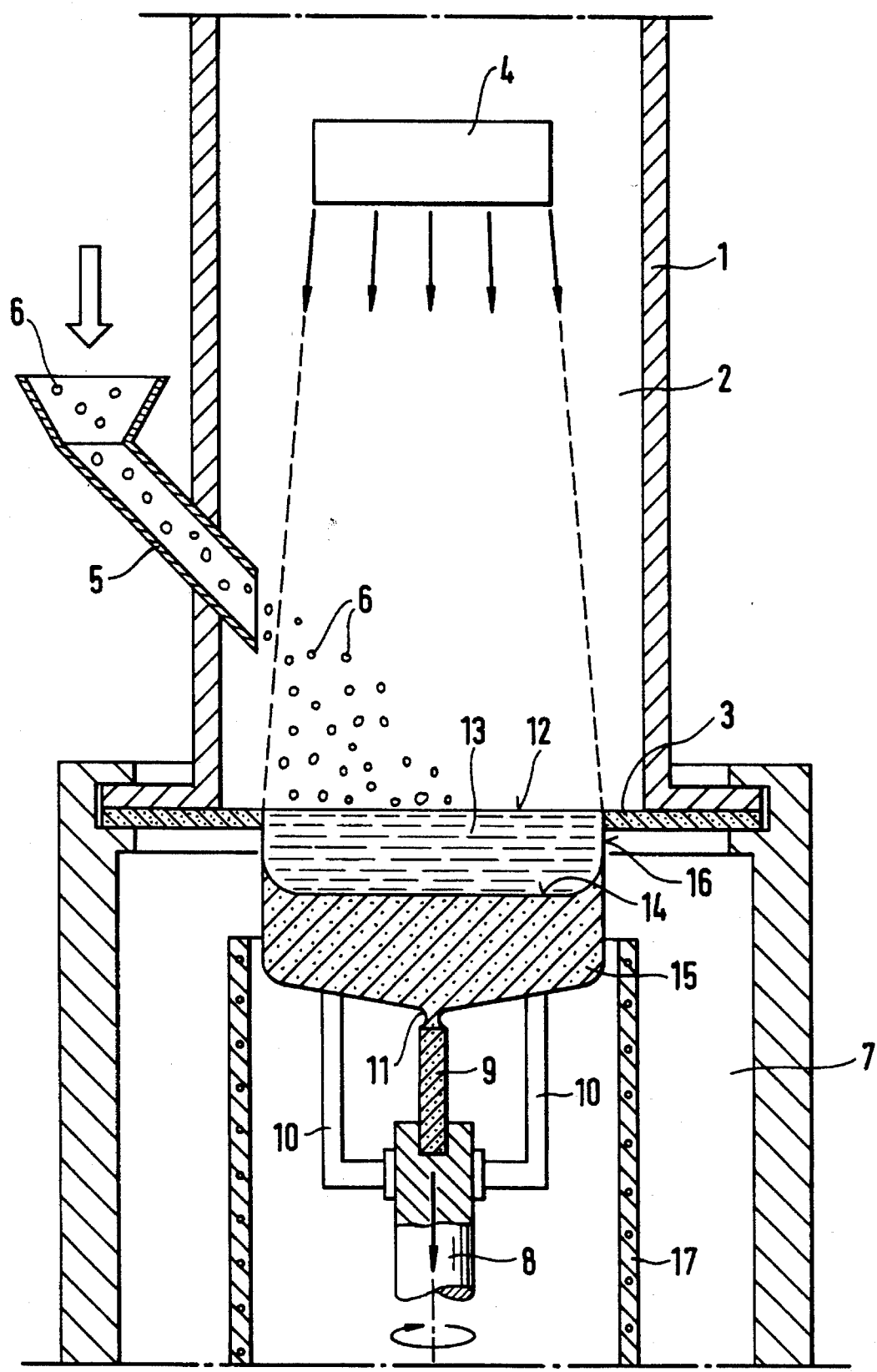
FIG. 1 shows the production of a single-crystal round rod.

Turning now in detail to the drawings, FIG. 1 shows a charging and melting chamber 2, which is only indicated schematically for reasons of clarity, surrounded by a shield 1 of inert material, preferably silicon, which chamber is closed at the bottom by a sealing and support plate 3 of silicon which is still completely solid at the beginning of the process. In the chamber there is an electronic beam source 4 directed at the support plate 3. In addition, there is here also the opening of a charging duct 5 through which granular material 6 can be charged onto the bottom surface formed by the support plate from a silicon reservoir which is not shown, is located outside and, if desired, can be heated.

Below the sealing and support plate there is the crystallization chamber 7 in which there is provided a vertically movable and rotatable crystal holder 8 in which a seed crystal 9 is fixed and against which there are advantageously placed additional supports 10 which serve to take up and stabilize the crystal rod formed.

At the beginning of the crystallization process, the seed crystal is moved up to its initial position which is preferably immediately below the center of the sealing and support plate 3 which is still completely closed and solid. With the aid of the electron beam source 4, this is then slowly melted from the middle until there is formed a lens of melt, which is only small at first, with which the seed crystal can be brought into contact from below. Then, a constriction 11 (the so-called "dash neck") can first be produced, in the manner known from, for example, crucible drawing, to remove dislocations, until subsequently the diameter of the lens of melt is gradually enlarged by enlarging the irradiated surface to finally reach the nominal diameter of the crystal. In this procedure, the seed crystal is advantageously rotated and slowly lowered, during which it may already be necessary to simultaneously charge granular material into the irradiated free surface of the molten phase so as to maintain the level of the melt.

The actual drawing process follows this starting-up phase. Here, granular material 6 is fed continuously or batchwise into the free surface 12, which is maintained at a temperature of up to 200° C., preferably from 50° C. to 150° C., above the melting point with the aid of the radiated energy, of the molten phase 13 via the charging duct 5. Simultaneously, at the opposite interface 14 between the molten phase 13 and the solid phase, the crystal 15, material passes from the molten to the solid state and grows on the crystal 15. By lowering the simultaneously rotating crystal holder 8 to the degree to which material is charged and grows on the crystal, the level of the molten phase is kept constant at the level of the sealing and support plate 3, while the growing crystal is drawn downwards from the melt. Here, care also has to be taken to ensure that the length of the free side meniscus 16 of the molten phase 13 which forms between the support plate 3 and the crystal 15 and, for example, makes possible the rotation, does not exceed the permissible limiting value at which the meniscus tears and the melt runs away. According to experience, this limiting value is, for example, about 8 mm for silicon.

In the crystallization chamber 7, additional further heating 17 can be provided to make possible controlled cooling of the crystal and to avoid the occurrence of thermal stresses. Since, in the embodiment shown here, the melting chamber 2 and the crystallization chamber 7 can be held together adjacent one another in a gas-tight manner, various working pressures can also be set. While, for example, a very good vacuum of advantageously from $10^{-1}$ to $10^{-5}$ mbar is set in the melting chamber 2, if only because of the electron radiation, the pressure in the crystallization chamber 7 can also be maintained at significantly higher values in comparison, preferably from 1 to 50 mbar, for example if an atmosphere containing particular gases is desired. This can be the case, for example, if the diffusion of impurities into the hot crystal is reduced by a stream of flushing gases, e.g., inert gas such as argon, or doping via the molten phase, is to be carried out by means of added doping gases. This pressure difference also has the advantage that the free side meniscus 16 of the molten phase is supported and stabilized.

On reaching the intended crystal length, the drawing process is preferably ended by the irradiated area being gradually decreased so that the crystal diameter is correspondingly reduced and finally the crystal, which has been drawn down to a point, rises from the remaining lens of melt. The remaining melt can subsequently be completely solidified by, for example, further reduction of the radiated power. The melting and crystallization chambers are thus again separated by a solid sealing and support plate as at the beginning of the process, so that after taking out the finished crystal, if desired exchanging the support plate and providing a seed crystal, the next drawing process can be commenced in a similar manner.

Figure 2:
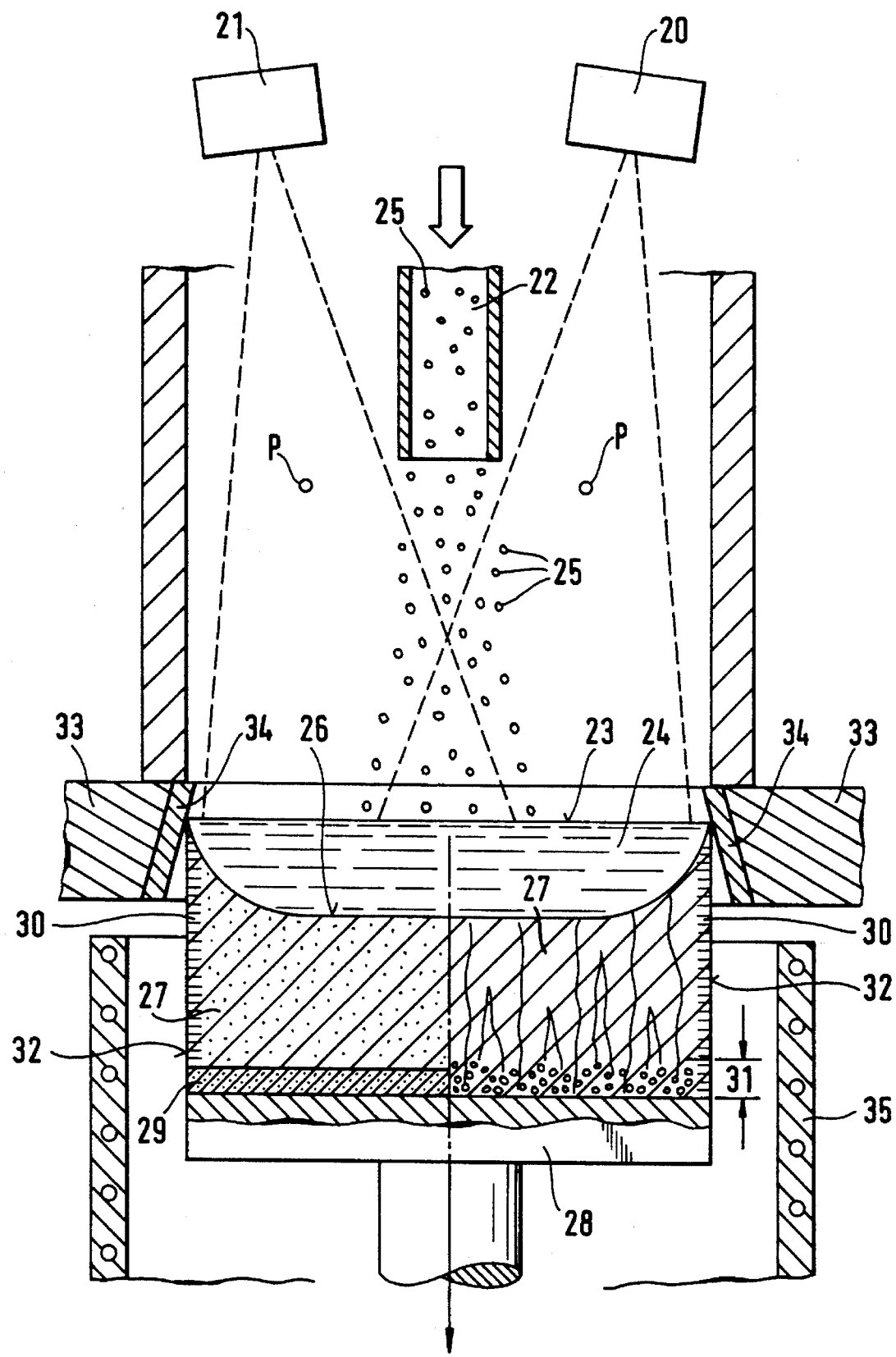
FIG. 2 shows the production of a polycrystalline block having a square cross section.

FIG. 2 schematically shows a second embodiment of the process suitable for the production of block-shaped crystals and also an apparatus suitable for carrying it out.

In an advantageously gas-tight or evacuable receptacle not shown for reasons of clarity, there are provided one or more, for example two, electron beam heat sources 20, 21 and also a charging duct 22, with the aid of which the free surface 23 of a molten phase 24 can be uniformly heated and supplied with granular material 25. At the opposite surface, the molten phase goes over via the interface 26 into the crystal 27 which rests on a holding plate 28 which can be lowered, heated or cooled.

In the crystallization process, using a process procedure similar to that explained for FIG. 1, granular material 25 is, while supplying energy, charged onto the free surface 23 of the melt, where it melts and thus simultaneously initiates growth of the crystal 27 at the opposite liquid/solid interface. The holding plate 28 is lowered at a rate corresponding to the growth rate, so that finally the molten phase remains on the same level while the gradually growing crystal is drawn downwards.

To commence the crystallization process, the holding plate 28 is, in the first phase, moved upwards to the starting position. The holding plate can here be coated with a seed crystal plate 29 (shown in the left-hand half of FIG. 2), for example comprising a single crystal, which is then partly melted to produce the molten phase, if desired with the feed of granular material being commenced at this stage. This process embodiment allows essentially single-crystal blocks to be produced in the further crystallization, with these blocks having polycrystalline regions only in the edge zone 30. If coarse crystalline seed crystal plates are used, blocks having a polycrystalline, columnar structure of single-crystal regions having the crystallographically preferred direction are also obtained.

Such blocks can also be produced, according to another simpler process embodiment, by in the initial phase charging granular material onto the holding plate 28 in the starting position. This material is then first sintered to form an intermediate layer 31 before the radiation power is increased after reaching a sufficient layer thickness and a molten phase covering the sintered layer is produced. The actual crystallization process then produces polycrystalline material which is particularly suitable for the production of solar cells. This embodiment is shown in the right-hand half of FIG. 2.

The cross section of the crystal 27, which is preferably square, tetragonal or hexagonal, and its sides 32, are preferably predetermined by cooled, movable segments 33 which are arranged in the shape desired in each case. The surfaces 34 of these segments coming into contact with the silicon melt, which favorably widen in the drawing direction, are advantageously made of silicon to minimize the risk of contamination. Surprisingly, these surfaces are not wetted by the molten phase since, as a result of the energy radiation and the cooling effect going out from the segments, surface currents partially transport the granular material charged to the edge of the molten phase, where it forms a sintered layer against the cold segment, which layer prevents direct contact of the segment with the melt.

Advantageously, there is also provided further heating 35, e.g., of resistance-heated plates, which surrounds the crystal after its exit from the actual crystallization zone and serves to ensure uniform and slow cooling and thus finally a low-stress final state of the product. The block obtained can, if desired, after removal of the disrupted edge regions, for example by sawing into individual blocks which can then in turn be sawn, for example, by means of wire or reciprocating saws, into wafers as solar cell base material.

The process of the invention allows the production of crystals of semiconductor materials which expand on solidification, such as silicon or germanium, having either a round or polygonal, preferably square, tetragonal or hexagonal cross section. It is particularly well suited for the production of crystals having a large cross section, i.e., up to about 200 mm in diameter, or edge lengths up to about 500 mm. The advantages are primarily that neither melting crucibles nor molds are required, and thus contamination-free crystal growth is made possible. In addition, crystallization occurs over a substantially planar crystallization front which effects, for example, a particularly uniform orientation of the single-crystal regions in polycrystalline material and a homogeneous dopant distribution. Furthermore, in analogy to zone refining, segregation effects contribute to a particularly pure product being obtained. In particular, carbon entrainment can be greatly reduced in the process, since the use of carbon-containing materials or auxiliaries can be largely omitted. In addition, low oxygen contents can also be achieved, since no contact of the molten phase with the walls of quartz vessels is required and the process can be carried out under oxygen-depleting pressure conditions. A further advantage is that no preformed rods produced by a complicated deposition process are required as starting materials. Instead, use can be made of granular material which can easily be further charged and which can also be obtained, for example, from deposition in a moving-bed reactor. Finally, mention may also be made of the high crystallization rates achievable, the low-stress crystal cooling and the problem-free process control which is carried out via easily controllable process parameters. Not least, reference may be made to the favorable energy balance of the process which is based on the fact that during the whole process, only a small amount of molten material has to be provided, and the fact that the heat of crystallization recovered on solidification can be utilized for melting the granular material added.

The process is further illustrated below by way of example, which are not to be deemed limitative of the invention.

EXAMPLE 1

In an arrangement corresponding to FIG. 1, an electron beam source was aligned in a vertical position in such a way that a vertical electron beam could be directed onto the middle of the sealing and support plate about 100 cm away. This support plate comprised a silicon disk having a thickness of about 7.5 mm and which formed the lower boundary of the melting chamber having a diameter of about 20 cm and the upper boundary of the crystallization chamber, the diameter of which was about 30 cm. The melting chamber was evacuated to a pressure of $10^{-6}$ mbar, while in the crystallization chamber a pressure of about 1 mbar was set with the aid of a constant argon stream. Below the center, a crystal holder with a single seed crystal of silicon (diameter about 3 mm (100) orientation) was moved up to the support plate, leaving a narrow gap.

Next, the radiation of energy was commenced and in the center of the support disk there was produced a lens of melt whose upper diameter was about 12 mm, and whose lower diameter was about 4 mm. The seed crystal could now be joined up and set into rotation at about 10 rpm. With gradual lowering of the crystal holder, the lens of melt was first narrowed until the so-called "dash neck" had formed and dislocation-free growth had been achieved. Then, in the cone drawing phase, the diameter of the lens of melt was steadily enlarged with careful monitoring and matching of the lowering rate of the crystal holder, until the desired nominal diameter of the crystal to be drawn of about 150 mm had been reached. The course of this phase can be made easier by the provision of a support plate which possesses a thickened central region which is adjoined by a thinner transition region up to about the desired nominal diameter of the crystal, which transition region is surrounded by an outer region possessing the original thickness. To keep the depth of the molten phase constant in the final phase of cone drawing, granular silicon material (particle size 1–5 mm, specific resistance about 1 $\Omega$cm) was at this stage charged into the free surface of the melt via the granular material feeder.

During the subsequent growth phase, the free surface was maintained at a temperature of about 1540° C. to 1550° C. by irradiation at a power of about 40 W/cm$^2$. The thickness of the molten phase was about 12 mm, the free side meniscus had a length of about 7 mm. The granular material of the above-mentioned specification was charged at a rate of about 41 g/min and made possible crystal growth and thus a drawing rate of about 1 mm/min. The rotation rate of the crystal holder was about 10 rpm. To relieve thermal stresses, the crystal after crystallization passed through an additional further heating region, about 5 cm long, in the form of a heating ring having a diameter of about 18 cm and maintained at about 1000° C.

On reaching a length of about 30 cm, the irradiated area was continuously reduced in size and the feed of granular material was throttled back, whereby a cone-like reduction of the crystal diameter could be achieved, until finally the connection between the crystal point and the remaining lens of melt tore off. The energy supplied was then stopped, the support plate was allowed to solidify completely, and finally the crystal was taken out.

The crystal obtained was a single crystal and free of dislocations. The material obtained was a p-type conductor, the specific conductivity over the length of the crystal being about 1 $\Omega$cm.

EXAMPLE 2

An arrangement constructed in accordance with FIG. 2 was equipped with a square holding plate having edge lengths of about 300 mm which was made of copper and in its interior had a cooling system supplied with water. The holding plate was initially moved all the way up and thereby enclosed, with the outwardly sloping, silicon-plate-covered interior walls of the likewise water-cooled segments, a hollow space about 5 cm deep.

Feed of granular material was then started and granular material (specification as in Example 1) was charged onto the holding plate. After reaching a bed depth of about 3 cm, the supply of energy was commenced via the two electron beam sources (power initially about 27 kW) and a sintering together of the granular material was thereby effected. The radiated power was then increased, with continuation of the feed of granular material, until the granular material started to melt from the top. At the same time, the holding plate was slowly lowered to keep the melt surface at a constant level. Finally, a molten phase having a depth in the middle of about 50 mm had formed, while in the region of contact with the segment surfaces, granular material had collected and there was formed a thin sintered layer which shielded the molten phase toward the outside.

Then commenced the actual growth phase in which granular material (preheated to about 120° C.) was charged into the free surface of the molten phase at a rate of about 24 g/min with constant radiation of energy. This resulted in a growth rate at the opposite liquid/solid phase boundary of about 2 mm/min, at which rate the holding plate was also lowered. The crystal growth was polycrystalline with a columnar structure having crystallite sizes of up to about 5 mm.

On reaching a block thickness of about 40 cm, the feed of granular material was stopped and with gradually decreased radiation of energy, the block was allowed to solidify completely. After a cooling phase of about 6 hours to slowly decrease the vertical temperature difference, the block was taken out, cooled to room temperature and the edge regions containing sintered granular material were removed.

Subsequent examination of the material gave the excellent value of from $10^3$ to $10^5$/cm$^2$ for the dislocation density. At about $10^{16}$ atoms of C/cm$^3$, the carbon contents were in the range of the starting granular material and showed that no contamination had been introduced during production of the block. The oxygen contents were significantly reduced in comparison with the starting value and were in the region of $5 \times 10^{15}$ atoms of O/cm$^3$. It is thus shown that the process is exceptionally suitable for the production of silicon blocks as starting material for solar cells.

While several embodiments of the present invention have been shown and described, it is to be understood that many changes and modifications may be made thereunto without departing from the spirit and scope of the invention as defined in the appended claims.

What is claimed is:

1. A process for producing rods or blocks of semiconductor material which expands on solidification by crystallization of a melt produced from granular material, comprising producing a molten phase of the semiconductor material covering a solid phase of the semiconductor material, said molten phase having a surface contacting said solid phase and said molten phase having a free surface opposite this solid phase;

maintaining the molten phase during the crystallization by supplying energy and charging granular semiconductor material continuously or batchwise to the free surface, and at the surface contacting said solid phase, causing semiconductor material to grow on the solid phase; and stabilizing the free surface of the molten phase at the sides by surrounding solid semiconductor material.

2. The process as claimed in claim 1, comprising supplying said energy by radiation.

3. The process as claimed in claim 1, comprising supplying said energy by electron radiation.

4. The process as claimed in claim 1, comprising using silicon as the semiconductor material.

5. The process as claimed in claim 1, comprising lowering the solid phase during the crystallization with or without rotation, in relation to the molten phase at a rate which essentially corresponds to the rate of growth of the semiconductor material.

6. The process as claimed in claim 1, comprising matching the thickness of the molten phase and the particle size of the granular material charged so that this thickness corresponds to at least twice the maximum immersion depth of the grains of granular material in the molten phase.

7. The process as claimed in claim 1, wherein the thickness of the molten phase is a maximum 50 mm.

8. The process as claimed in claim 1, wherein the granular material used has an average particle size of from 0.1 to 10 mm.

9. The process as claimed in claim 1, wherein the granular material used has an average particle size of from 0.1 to 6 mm.

10. The process as claimed in claim 1, wherein the temperature difference within the molten phase is a maximum of 200° C.

* * * * *